(12) United States Patent
Baniecki et al.

(10) Patent No.: US 6,815,343 B2
(45) Date of Patent: Nov. 9, 2004

(54) GAS TREATMENT OF THIN FILM STRUCTURES WITH CATALYTIC ACTION

(75) Inventors: John D. Baniecki, Kanagawa (JP); Robert B. Laibowitz, Cortlandt Manor, NY (US); Christopher C. Parks, Poughkeepsie, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/334,178

(22) Filed: Dec. 30, 2002

(65) Prior Publication Data

US 2004/0126939 A1 Jul. 1, 2004

(51) Int. Cl.⁷ .............................................. H01L 21/44
(52) U.S. Cl. ...................... 438/652; 438/660; 438/686
(58) Field of Search ........................ 257/750, 754, 257/761; 438/652, 656, 660, 685, 686

(56) References Cited

U.S. PATENT DOCUMENTS

| | | | | |
|---|---|---|---|---|
| 5,907,790 A | * | 5/1999 | Kellam | 438/666 |
| 6,197,631 B1 | * | 3/2001 | Ishihara | 438/240 |
| 6,252,270 B1 | * | 6/2001 | Gregor et al. | 257/315 |
| 6,420,236 B1 | * | 7/2002 | Hu et al. | 438/291 |
| 6,436,816 B1 | * | 8/2002 | Lee et al. | 438/643 |
| 2002/0031920 A1 | * | 3/2002 | Lyding et al. | 438/795 |

* cited by examiner

Primary Examiner—T. N. Quach
(74) Attorney, Agent, or Firm—Scully, Scott, Murphy and Presser; Robert M. Trepp

(57) ABSTRACT

A method of substantially reducing and/or eliminating the amount of defects and/or impurities that amass at interfacial surfaces that are present in a multilayer structure is provided. Specifically, the method improves the efficiency of a forming gas anneal by providing a multilayer structure having a catalytic layer formed thereon or buried therein which allows for a significant increase in the amount of hydrogen or deuterium which can be incorporated into the structure. The method is also conducted at a low temperature (on the order of about 400° C. or less). Multilayer structures are also provided which include an annealed multilayer structure having at least one interfacial surface present therein. The at least one material interface contains a region of hydrogen or deuterium which substantially reduces defects and impurities present at the at least one interface.

11 Claims, 3 Drawing Sheets

GAS TREATMENT OF THIN FILM STRUCTURES WITH CATALYTIC ACTION

FIELD OF THE INVENTION

The present invention relates to semiconductor device fabrication, and more particularly to a method of incorporating a gaseous species such as hydrogen or deuterium into integrated circuit (IC) materials in order to passivate and/or neutralize defects which may occur at interfaces between a metal and an insulator, a metal and a semiconductor, a semiconductor and an insulator or a semiconductor and a metal. The present invention also relates to the incorporation of such gaseous species into IC materials in order to reduce or clean interfacial surfaces. The present invention further relates to novel structures to enhance this incorporation.

BACKGROUND OF THE INVENTION

High-density integrated circuits are composed of various layers of metals, insulators and semiconductors forming many highly complex interfaces. The term "interface" is used throughout the instant application to denote a surface forming a common boundary of two layers. The interface may be a continuous interface found across the entire wafer or, the interface may be a discontinuous interface found only in portions of the structure. A discontinuous interface could be exemplified as the interface formed between an unpatterned layer and a patterned layer, or two patterned layers. Defects and impurities, which are known to accumulate at these interfaces, oftentimes deteriorate the quality of the interface. In particular, the accumulation of defects and impurities at some interfaces may lower the barrier height causing increased current leakage in the IC. Moreover, charge, either fixed or mobile, can gather at some interfaces, such as, for example, the interface between Si and insulators deposited thereon, altering the 'turn on' voltage for any subsequent field effect devices utilizing the interface.

In the prior art, it has been found that annealing these circuits in hydrogen or its isotope deuterium can neutralize the effects of defects and impurities at Si/insulator interfaces by significantly decreasing the interfacial charge density. The hydrogen or deuterium is usually mixed with an inert gas such as argon or nitrogen in a ratio of about 5% hydrogen or deuterium with 95% nitrogen or argon. The resultant mixture is typically referred to in the art as a 'forming gas' and the annealing process is typically referred to in the art as a 'forming gas anneal'. Such anneals are typically carried out at a temperature between 350° C. and 650° C. and are a major step in the fabrication of ICs.

Despite the known benefits of forming gas anneals to neutralize the interfacial defects and impurities present in ICs, prior art forming gas anneals are not efficient since it is difficult to incorporate atomic hydrogen into the sample. There is thus a need for developing a new and improved method that significantly improves the efficiency of the forming gas anneal incorporating more hydrogen or deuterium into the IC and at lower temperatures than conventional forming gas anneals. Reduced temperature is quite important in reducing the thermal budget that can be especially important in back-end-of-the-line (BEOL) applications.

SUMMARY OF THE INVENTION

The present invention provides a method of substantially reducing and/or eliminating the amount of defects and/or impurities that amass at interfacial surfaces that are present in a multilayer structure. Specifically, the inventive method improves the efficiency of a forming gas anneal by providing a multilayer structure having a catalytic layer formed thereon or buried therein which allows for a significant increase in the amount of hydrogen or deuterium which can be incorporated into the structure.

The inventive method is also conducted at a low temperature (on the order of about 400° C. or less).

Specifically, the method of the present invention comprises the steps of:

providing a multilayer structure having at least one interfacial surface;

forming a catalytic material atop said multilayer structure; and annealing said multilayer structure including said catalytic material in a forming gas ambient and at a temperature of about 400° C. or less.

The catalytic material used in the present invention may be a catalytic film (or layer) or one or more catalytic particles. The catalytic material may be present atop the multilayer structure, or in some embodiments, one or more additional layers are formed over the catalytic material such that the catalytic material is buried within the structure. The catalytic material may be continuous across the entire multilayer structure, or it may be discontinuous appearing as an isolated island or region. The catalytic material may be a sacrificial material which is removed after annealing, or it may be a component of the multilayer structure that remains after processing has been completed.

The term "catalytic material" is used in the present invention to denote any material, such as a metal, which has a high affinity for absorbing hydrogen and deuterium, yet allows absorbed hydrogen and deuterium to readily desorb therefrom such that the amount of hydrogen or deuterium which gets incorporated into the interfacial regions of the multilayer structure is significantly increased. Illustrative examples of such catalytic material include metals selected from group VIB, VIIB, VIIIB and IB of the Periodic Table of Elements including alloys thereof. Highly preferred catalytic materials employed in the present invention are metals selected from group VIIIB, with Pd and Pt being most preferable.

The present invention also relates to a multilayer structure that is formed utilizing the method of the present invention. Specifically, the inventive structure comprises:

an annealed multilayer structure having at least one interfacial surface present therein, wherein said at least one interfacial surface contains a region of hydrogen or deuterium which substantially reduces defects and impurities present at said at least one interfacial surface.

The inventive structure described above may also include a conductive electrode either on a surface of the annealed multilayer structure or buried in the structure itself. The conductive electrode may be the catalytic material described above.

DETAILED DESCRIPTION OF THE INVENTION

Figure 1A:
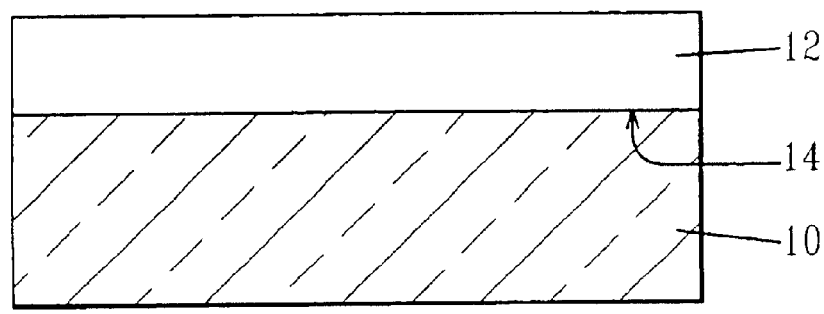
FIGS. 1A–1C are pictorial representations (through cross sectional views) illustrating the basic processing steps employed in one embodiment of the present invention.

The present invention, which provides a method to enhance the incorporation of hydrogen or deuterium into a multilayer structure so as to substantially reduce and/or eliminate the defects and/or impurities which typically accumulate at an interfacial region present in the multilayer structure, will now be described in greater detail by referring to the drawings that accompany the present application. In the accompanying drawings, like and/or corresponding elements are referred to by like reference numerals.

Reference is first made to the initial multilayer structure illustrated in FIG. 1A. The illustrated initial multilayer structure comprises at least first material layer 10 and second material layer 12 located atop the first material layer such that interfacial surface (or region) 14 is located between the first and second layers. It is noted that the present invention is not limited to a multilayer structure that includes two material layers as is illustrated in FIG. 1A. Instead, the present invention completes the use of multilayer structures that include a plurality of such material layers.

The plurality of material layers that are present in the multilayer structure may include any combination of a metal, an insulator, or a semiconductor with the proviso that each successive material layer is composed of a different material such that an interfacial surface exists between the material layers.

Thus in the embodiment illustrated in FIG. 1A, the multilayer structure could include one of the following:

first material layer 10 is a metal and second material layer 12 is an insulator;

first material layer 10 is a metal and second material layer 12 is a semiconductor;

first material layer 10 is an insulator and second material layer 12 is a metal;

first material layer 10 is an insulator and second material layer 12 is a semiconductor;

first material layer 10 is a semiconductor and second material layer 12 is an insulator; or first material layer 10 is a semiconductor and second material layer 12 is a metal.

Note that first material layer 10 and second material layer 12 may be both composed of a metal, an insulator, or a semiconductor provided that the material are different so that an interfacial surface is present between the materials.

The term "metal" is used throughout the present application to denote any of various opaque, fusible, ductile and typically lustrous substances that are good conductors of heat, form cations by loss of electrons, and yield basic oxides and hydroxides. Illustrative examples include metals selected from group VIB, VIIB, VIIIB, IB, and/or IIB of the Periodic Table of Elements including alloys thereof. In a highly preferred embodiment of the present invention, it is preferred that the metal be a conductive metal, including, but not limited to: Cu, W, Ni, Pt, Pd, Ag, Ru, Ta and/or Au.

The term "insulator" is used throughout the present application to denote any material that is a poor conductor of electricity. Illustrative examples of insulators that can be employed in the present invention include, but are not limited to: polyimides, polyamides, oxides, nitrides or oxynitrides, diamond, diamond-like carbon and the like. The insulators may be crystalline, polycrystalline or amorphous. Preferred insulators are oxides such as $SiO_2$, titanates, niobates, silicates, tantalates, $HfO_2$, $ZrO_2$ and $Ta_2O_5$.

The term "semiconductor" is used throughout the present application to denote any of a class of solids whose electrical conductivity is between that of a conductor and that of an insulator in being nearly as great as that of a metal at high temperatures and nearly absent at low temperatures. Illustrative examples of semiconductors that can be employed in the present invention include, but are not limited to: Si, Ge, SiGe, SiGeC, SiC, GaP, GaAs, InAs, InP and other III/V compound semiconductors.

The various material layers of the multilayer structure may be formed utilizing one or more conventional deposition processes including, but not limited to: chemical vapor deposition (CVD), plasma-assisted CVD, atomic layer deposition, evaporation, sputtering, chemical solution deposition and the like. Alternatively, the material layers of the multilayer structure may be formed by a conventional growing technique. The thickness of the various material layers of the multilayer structure are of no importance to the present invention, so as long as the materials are thick even to form an interfacial layer therebetween.

It is noted that the material layers of the multilayer structure employed in the present invention may be unpatterned, as is shown, or one or more of the material layers may be patterned. Patterned layers are typically formed utilizing conventional lithography which includes applying a resist to the layer to be patterned, exposing the resist to a pattern of radiation, developing the exposed resist and transferring the pattern from the exposed resist into the structure via an etching process. Following etching, the exposed resist is removed from the structure.

For illustrative purposes only, first material layer 10 is a Si semiconductor and second material layer 12 is an insulator such as $SiO_2$. The $SiO_2$ layer may be formed via one of the deposition processes mentioned above, or alternatively a thermal oxidation process may be used in growing the $SiO_2$ layer on the Si substrate.

In accordance with the present invention, catalytic material 16 is formed atop material layer 12 utilizing a conventional deposition process as mentioned above. The resultant structure including catalytic material 16 is shown, for example, in FIG. 1B. The thickness of the catalytic material may vary depending on the deposition process employed, but typically the catalyst material has a thickness of from about 5 to about 500 nm, with a thickness of from about 10 to about 100 nm being more highly preferred. The catalytic material may be a film, as shown, or it may exist as one or more particles on the surface of second material layer 12. The size of the particles may vary, but typically the particles have a mean particle size of from about 5 to about 500 nm.

Although the thickness and size of the catalytic material may vary, it has been found that thin films of catalytic material (on the order of less than 50 nm) allow for greater incorporation of hydrogen and deuterium into the multilayer structure.

As indicated above, the catalytic material may be continuous across the entire multilayer structure (as is shown), or it may be discontinuous appearing as an isolated island or region. The catalytic material may be a sacrificial material with is removed after annealing, or it may be a component of the multilayer structure which remains after processing has been completed. In the latter instance, the catalytic material that remains may be used as an electrode of a transistor or a capacitor (e.g., the top or bottom electrode).

The term "catalytic material" is used in the present invention to denote any material, such as a metal, which has a high affinity for absorbing hydrogen and deuterium, yet allows absorbed hydrogen and deuterium to readily desorb therefrom such that the amount of hydrogen or deuterium which gets incorporated into the interfacial regions of the multilayer structure is significantly increased, as compared to a system which does not utilize a catalytic material. Illustrative examples of such catalytic material include metals selected from group VIB, VIIB, VIIIB and IB of the Periodic Table of Elements including alloys thereof. Highly preferred catalytic material employed in the present invention is a metal selected from group VIIIB, with Pd and Pt being most preferable. It is also conceived that it is possible to apply the invention to catalyze or promotion other reactions that have desirable effects on the reliability or performance of the integrated circuit.

Figure 1B:
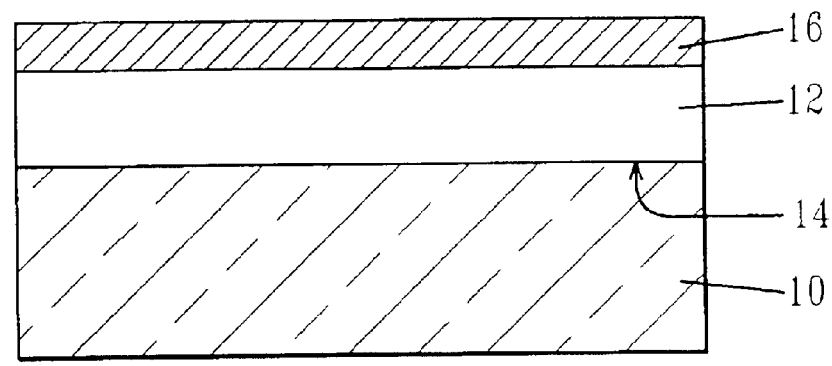

The structure containing the catalytic material such as shown, for example in FIG. 1B, is then subjected to a forming gas anneal which is conducted at a temperature of about 400° C. or less. More preferably, the forming gas annealing is conducted at a temperature of less than about 350° C., with a forming gas anneal temperature of from about 20° C. to about 100° C. being even more highly preferred. The annealing time may vary, but typically the annealing is carried out for a time period of from about 1 to about 100 mins. More preferably, annealing is carried out for a time period of from about 5 to about 20 mins. The annealing step may be carried out utilizing a single ramp up rate, or multiple heat and soak cycles using the same or different ramp up rates may be employed.

The term "forming gas anneal" is used herein to denote an annealing process which includes hydrogen or its isotope deuterium that may be admixed with an inert gas such as He, Ar, $N_2$, Kr, Xe or mixtures thereof. In the present invention, the forming gas anneal is typically carried out using from about 1 to about 10% hydrogen or deuterium that is admixed with about 1 to about 10% inert gas. More preferably, the forming gas anneal step of the present invention is carried out using from about 5 to about 6% hydrogen or deuterium that is admixed with about 5 to about 6% inert gas. A preferred inert gas is He, $N_2$ or Ar.

At this point of the present invention, catalytic material layer 16 may or may not be removed from the structure. In the embodiment shown in FIG. 1C, catalytic material 16 is removed from the structure. When the catalytic material is removed from the structure, a conventional etching process that is highly selective in removing catalytic material from the multilayer structure may be employed. For example, chemical etching, chemical mechanical polishing, sputtering or reactive ion etching can be used in removing the catalytic material from the structure.

Figure 1C:
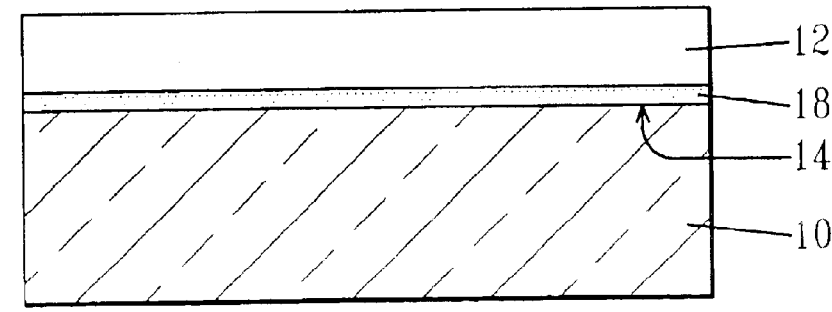

As is illustrated, the resultant structure shown in FIG. 1C is an annealed multilayer structure having at least one interfacial surface 14 present therein. The at least one interfacial surface of the annealed structure contains a region of hydrogen or deuterium (denoted by reference numeral 18) which substantially reduces defects and impurities present at the at least one interfacial surface. In some embodiments, catalytic material 16 remains in the structure and is used as a component of a complementary metal oxide semiconductor (CMOS) device. The region of hydrogen or deuterium is in close proximity to the interfacial surface. The region of hydrogen or deuterium may be above, below, in contact with or overlapping the interfacial surface.

The resultant structure shown in FIG. 1C may then be subjected to conventional CMOS processing steps which are well known to those skilled in the art. For example, transistor-processing steps including gate formation, source/drain formation, silicidation and interconnection may be carried out. In the embodiment wherein the catalytic material is not removed from the structure, the catalytic material may serve as an electrode of a transistor or capacitor.

Figure 2A:
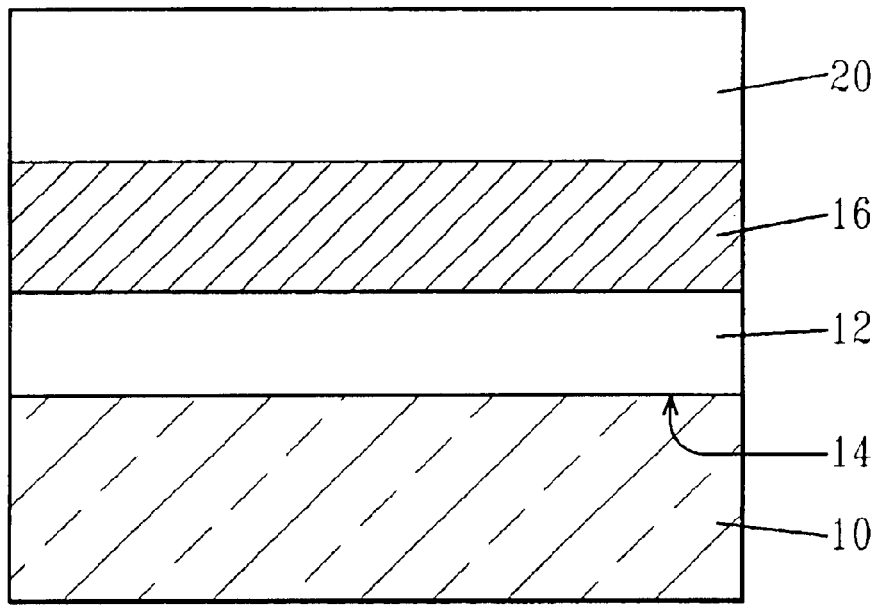
FIGS. 2A–2B are pictorial representations (through cross sectional views) illustrating the basic processing steps employed in another embodiment of the present invention. In these drawings, the catalytic material is a buried material.

In an alternative embodiment of the present invention, catalytic material 16 is buried within the multilayer structure itself. This embodiment of the present invention is shown, for example, in FIGS. 2A–2B. Specifically, FIG. 2A shows a multilayer structure comprising first material layer 10, second material layer 12 formed atop first material layer 10 so as to form interfacial surface 14, catalytic material 16 formed atop second material layer 12 and third material layer 20 formed atop catalytic material 16. The various layers of the multilayer structure including the catalytic material may be unpatterned, as shown, or patterned. Third material layer may be composed of a semiconductor material, an insulator, or a metal. For illustrative purposes, third material layer 20 is composed of $SiO_2$, catalytic material 16 is composed of a Pt film, second material layer 12 is composed of $SiO_2$ and first material layer 10 is composed of Si.

Figure 2B:
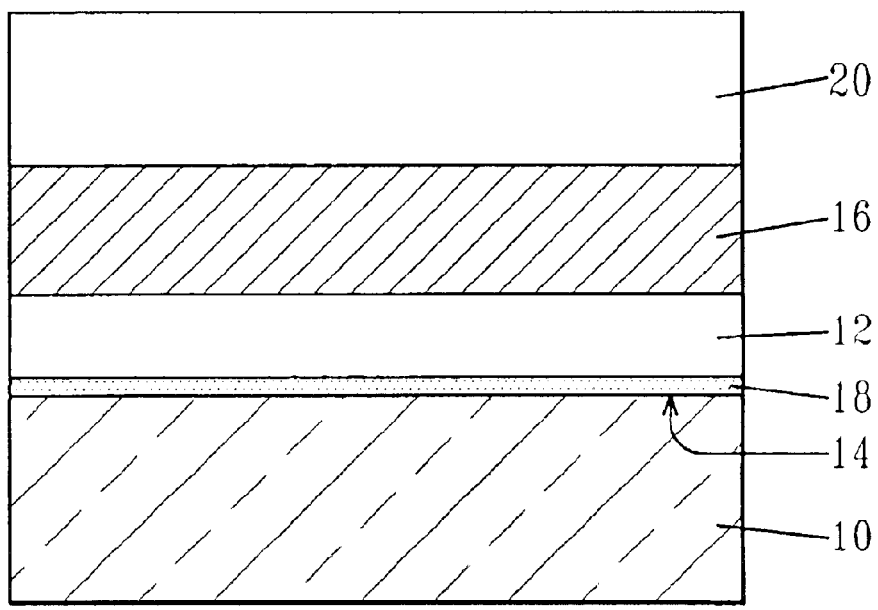

The structure shown in FIG. 2A is then annealed as described above providing the structure shown, for example, in FIG. 2B. The annealed multilayer structure shown in FIG. 2B has at least one interfacial surface (14) that contains a region of hydrogen or deuterium (denoted by reference numeral 18) which substantially reduces defects and impurities present at the at least one interfacial surface.

It is again noted that the present invention provides a means for incorporating more hydrogen or deuterium into a multilayer structure which helps to eliminate or mitigate the amount of defects or impurities which exist at the interfacial regions present in the structure. The amount of hydrogen that is incorporated into the structure may vary depending upon the catalyst material used, the thickness of the catalyst material and the annealing conditions. The method of the present invention may provide a factor of 50 enhancement over the uncatalyzed case.

The following example is provided to illustrate the method of the present invention and some of the advantages that can be obtained therefrom as compared with a conventional forming gas anneal where no catalytic material is employed.

EXAMPLE

In this example, a comparative sample was prepared and compared against a sample that were prepared in accordance with the inventive method described above.

Figure 3:
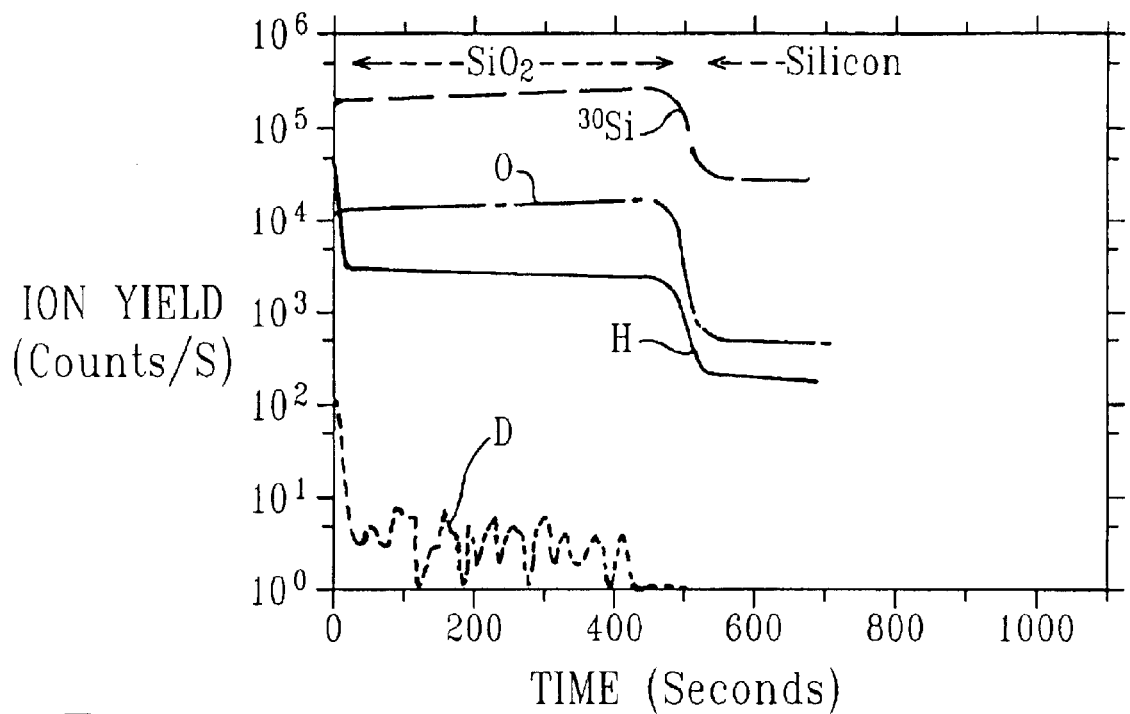
FIG. 3 is a graph of ion yield vs. time for a multilayer structure that is prepared without a catalytic material being present.

The comparative sample consisted of a Si wafer which had an insulating thin film of amorphous silicon dioxide ($SiO_2$) formed thereon. The comparative sample thus contained an interfacial region between the Si wafer and the amorphous Si. The comparative sample was placed in an annealing oven and annealed at 21° C. for 20 minutes in a forming gas ambient which included a mixture of Ar and deuterium. In order to monitor the uptake of deuterium into the comparative sample, secondary ion mass spectroscopy (SIMS) was employed. The SIMS data for the comparative sample during the annealing is shown in FIG. 3. As illustrated, very little, if any, deuterium was incorporated into the comparative sample. This can be seen as the ratio of hydrogen (H) already in the sample to the amount of deuterium (D) is about equal to that found in nature.

Figure 4:
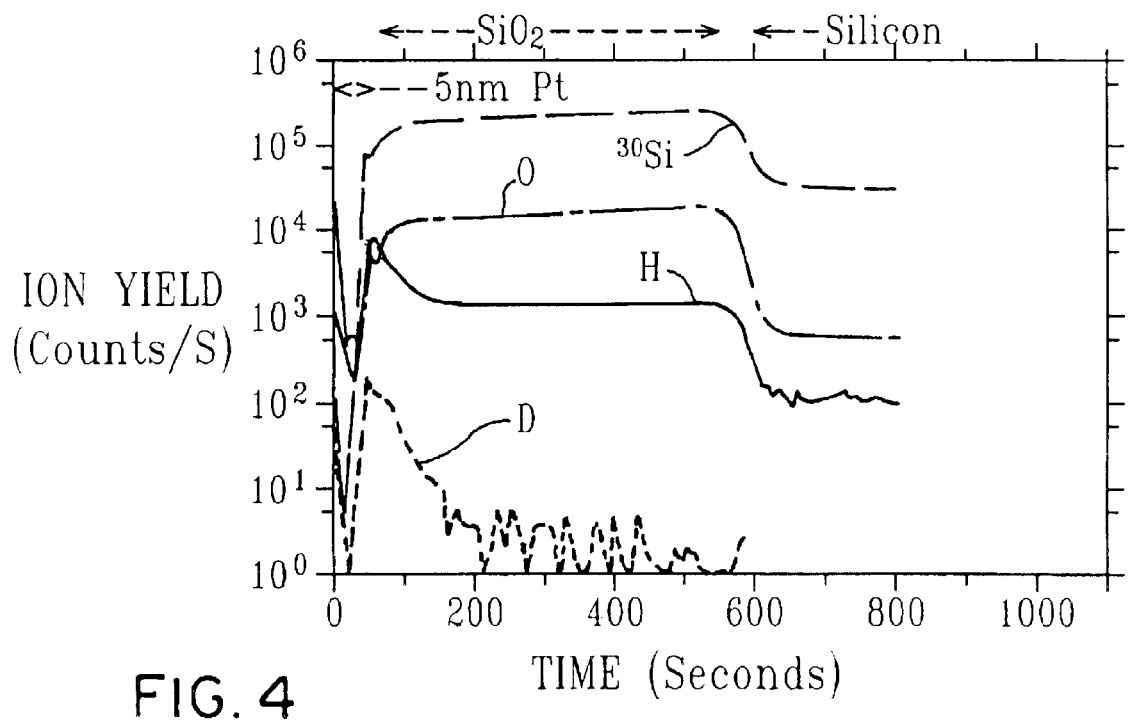
FIG. 4 is a graph of ion yield vs. time for a multilayer structure that is prepared in accordance with the present invention using a thin catalytic material.

A sample, representative of the present invention, was prepared by first forming an insulating thin film amorphous $SiO_2$ layer on the surface of a Si wafer. Atop the amorphous $SiO_2$ layer was deposited a 5 nm Pt thin film. The sample containing the thin film of Pt was then annealed as described above for the comparative example and the SIMS data was monitored throughout the entire anneal process. The SIMS results are illustrated in FIG. 4. Analysis of the SIMS results which are shown in FIG. 4 indicate that with the thin Pt layer in place a surprising increase in D incorporation of almost a factor of 50, extending well into the $SiO_2$ layer, was observed.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described, but fall with the scope of the appended claims.

Having thus described our invention in detail, what we claim is new and desire to secure by the Letters Patent is:

1. A method for the gas treatment of a multilayer structure comprising the steps of:

providing a multilayer structure having at least one interfacial surface;

forming a catalytic material atop said multilayer structure; and annealing said multilayer structure including said catalytic material in a forming gas ambient and at a temperature from about 20° C. to about 100° C.

2. The method of claim 1 wherein said multilayer structure comprises at least a first material layer and a second material layer, said materials layers are composed of a different material such that said interfacial surface exists between said material layers.

3. The method of claim 2 wherein said first material layer is a semiconductor, an insulator or a metal, and said second material layer is a semiconductor, an insulator or a metal.

4. The method of claim 3 wherein said first material layer is a semiconductor and said second material layer is an insulator.

5. The method of claim 1 further comprising forming a third material layer atop said catalytic material prior to annealing.

6. The method of claim 1 wherein said forming gas includes hydrogen or deuterium admixed with an inert gas.

7. The method of claim 1 wherein said catalytic material is a metal film or metal particles.

8. The method of claim 1 wherein said catalytic material is a metal selected from group VIB, VIIB, VIIIB and IB of the Periodic Table of Elements including alloys thereof.

9. The method of claim 1 wherein said catalytic material comprises Pd or Pt.

10. A method for the gas treatment of a multilayer structure comprising the steps of:

providing a multilayer structure having at least one interfacial surface;

forming a catalytic material atop said multilayer structure;
annealing said multilayer structure including said catalytic material in a forming gas ambient and at a temperature of about 400° C. or less; and removing the catalytic material.

11. A method for the gas treatment of a multilayer structure comprising the steps of:

providing a multilayer structure having at least one interfacial surface;

forming a catalytic material atop said multilayer structure;

forming a third material layer atop said catalytic material; and annealing said multilayer structure including said catalytic material in a forming gas ambient and at a temperature of about 400° C. or less.

* * * * *

UNITED STATES PATENT AND TRADEMARK OFFICE
CERTIFICATE OF CORRECTION

PATENT NO. : 6,815,343 B2
DATED : November 9, 2004
INVENTOR(S) : John D. Baniecki et al.

It is certified that error appears in the above-identified patent and that said Letters Patent is hereby corrected as shown below:

Column 1,
Line 30, "Defects and impurities" should start a new paragraph.

Signed and Sealed this

Twenty-fourth Day of May, 2005

JON W. DUDAS
*Director of the United States Patent and Trademark Office*